United States Patent
Dakshina-Murthy et al.

(10) Patent No.: US 7,795,046 B2
(45) Date of Patent: Sep. 14, 2010

(54) METHOD AND APPARATUS FOR MONITORING ENDCAP PULLBACK

(75) Inventors: Srikanteswara Dakshina-Murthy, Singapore (SG); Chew Hoe Ang, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 504 days.

(21) Appl. No.: 11/750,473

(22) Filed: May 18, 2007

(65) Prior Publication Data

US 2008/0283878 A1   Nov. 20, 2008

(51) Int. Cl.
*H01L 21/00* (2006.01)
(52) U.S. Cl. .................. 438/12; 257/E21.493
(58) Field of Classification Search .......... 257/288, 257/412; 438/12, 15–18, 622
See application file for complete search history.

(56) References Cited

U.S. PATENT DOCUMENTS

| | | | | |
|---|---|---|---|---|
| 6,287,904 | B1 * | 9/2001 | Lee et al. | 438/197 |
| 6,898,561 | B1 * | 5/2005 | Liu et al. | 703/14 |
| 7,002,397 | B2 * | 2/2006 | Kubo et al. | 327/534 |
| 7,407,847 | B2 * | 8/2008 | Doyle et al. | 438/164 |

* cited by examiner

*Primary Examiner*—W. David Coleman
*Assistant Examiner*—Christine Enad
(74) *Attorney, Agent, or Firm*—Timothy M. Honeycutt

(57) ABSTRACT

Various apparatus and methods of monitoring endcap pullback are disclosed. In one aspect, an apparatus is provided that includes a substrate that has a plurality of semiconductor regions. Each of the plurality of semiconductor regions has a border with an insulating structure. A transistor is positioned in each of the plurality of semiconductor regions. Each of the transistors includes a gate that has a first lateral dimension and an end that has a position relative to its border. A voltage source is electrically coupled to the transistors whereby levels of currents flowing through the transistors are indicative of the positions of the ends of the gates relative to their borders.

23 Claims, 5 Drawing Sheets

METHOD AND APPARATUS FOR MONITORING ENDCAP PULLBACK

BACKGROUND OF THE INVENTION

1. Field of the Invention

This invention relates generally to semiconductor processing, and more particularly to methods and apparatus for monitoring endcap pullback.

2. Description of the Related Art

Metal oxide semiconductor (MOS) devices are used extensively in conventional integrated circuits. A typical MOS device consists of a pair of source/drain impurity regions positioned in an active region of a silicon substrate but separated laterally to define a channel region. A gate dielectric layer is positioned over the channel region and a conductive gate, frequently composed of doped polysilicon, is positioned on the gate dielectric layer. In a conventional process for forming the gate, a blanket layer of polysilicon is deposited and a photoresist mask is formed on the polysilicon layer with a layout that corresponds to the desired layout of the gate. After the mask is formed, a photoresist trim etch is performed to reduce a lateral dimension of the mask. Such an etch trim is used to give the gate a length that is smaller than the smallest feature that may be printed lithographically. The polysilicon layer is next etched to define the gate and the mask is removed. The finished gate is frequently used as an implant mask during subsequent implants to form the source/drain regions.

Pullback of the ends or "endcaps" of polysilicon gates is a phenomena that is observed in sub-micron MOS processing. Pullback is essentially a shortening of the gate endcaps due to various process conditions. Some pullback is due to optical effects during mask formation. Additional pullback is caused during gate etch. The endcaps of gates tend to be more aggressively attacked during etching than other portions. Pullback due to optical effects is more pronounced where the exposure radiation wavelength is close to or even larger than the length of the printed gate. If the pullback is severe enough, the gate may not fully extend across the width of the active region. At the point of pullback, and perhaps for some distance towards the midpoint of the gate if the endcaps are significantly rounded, undesirable leakage currents can occur in the active region. Short channel effects are more severe at smaller gate lengths.

Accommodating for endcap pullback involves creating design rules that print gates with extra width built in so that full gate-to-active coverage is achieved even after pullback. Conventional design rules call for endcaps to be printed with a length (not to be confused with gate length) that is typically 1.0 to 2.5× the minimum feature size for a given technology.

It is not a trivial matter to settle on an acceptable design rule. One conventional technique involves lithographically patterning a series of gates that are positioned end-to-end with a preselected end-to-end spacing. Following etch trim, the end-to-end spacing is measured with a scanning electron microscope. If the spacing is deemed too large, the process is reviewed and the design rule altered accordingly. Scanning electron microscopy is time consuming and sometimes produces inaccurate results.

The present invention is directed to overcoming or reducing the effects of one or more of the foregoing disadvantages.

SUMMARY OF THE INVENTION

In accordance with one aspect of the present invention, a method of manufacturing is provided that includes providing a substrate that has a semiconductor region and an insulating structure. The semiconductor region and the insulating structure define a border. Plural conductor structures are formed on the substrate according to a planned layout. According to the planned layout, a first of the conductor structures has a first end projecting across the border over the semiconductor region a first planned distance and the other conductor structures have ends projecting respectively smaller planned distances across the border over the semiconductor region. The semiconductor region and the conductor structures are electrically connected between a voltage source and ground. Levels of currents flowing through the semiconductor region to or from the conductor structures are indicative of the actual positions of the first end of the first conductor and the ends of the other conductor structures relative to the border.

In accordance with another aspect of the present invention, a method of manufacturing is provided that includes providing a substrate that has a semiconductor region and an insulating structure. The semiconductor region and the insulating structure define a border. Plural conductor structures are formed on the substrate according to a planned layout. According to the planned layout, a first of the conductor structures has a first end projecting across the border over the semiconductor region a first planned distance and the other conductor structures have ends projecting respectively smaller planned distances across the border over the semiconductor region. The semiconductor region and the conductor structures are electrically connected between a voltage source and ground. Currents flowing through the semiconductor region to or from the conductor structures are monitored. The levels of the currents are indicative of the actual positions of the first end of the first conductor structure and the ends of the other conductor structures relative to the border.

In accordance with another aspect of the present invention, an apparatus is provided that includes a substrate that has a semiconductor region and an insulating structure. The semiconductor region and the insulating structure define a border. Plural conductor structures are provided on the substrate. Each of the conductor structures includes a first lateral dimension and an end that has a position relative to the border. Plural contacts are electrically coupled to the semiconductor region. Each of the contacts corresponds to one of the conductor structures, whereby the contacts, the semiconductor region and the conductor structures provide current pathways between the contacts and their corresponding conductor structures that have ends projecting across the border. A voltage source is electrically coupled to the conductor structures whereby levels of currents flowing through the semiconductor region to or from the conductor structures are indicative of the positions of the ends of the conductor structures relative to the border.

In accordance with another aspect of the present invention, a method of manufacturing is provided that includes providing a substrate that has a plurality of semiconductor regions. Each of the plurality of semiconductor regions has a border with an insulating structure. A transistor is formed in each of the plurality of semiconductor regions according to a planned layout in which a first of the gates has an end projecting across its border a first planned distance and the other gates have ends projecting respectively smaller planned distances across their corresponding borders. The transistors are electrically connected between a voltage source and ground. Levels of leakage currents flowing through the transistors are indicative of the actual positions of the ends of the gates relative to their corresponding borders.

In accordance with another aspect of the present invention, an apparatus is provided that includes a substrate that has a plurality of semiconductor regions. Each of the plurality of semiconductor regions has a border with an insulating structure. A transistor is positioned in each of the plurality of semiconductor regions. Each of the transistors includes a gate that has an end that has a position relative to its border. A voltage source is electrically coupled to the transistors whereby levels of currents flowing through the transistors are indicative of the positions of the ends of the gates relative to their borders.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
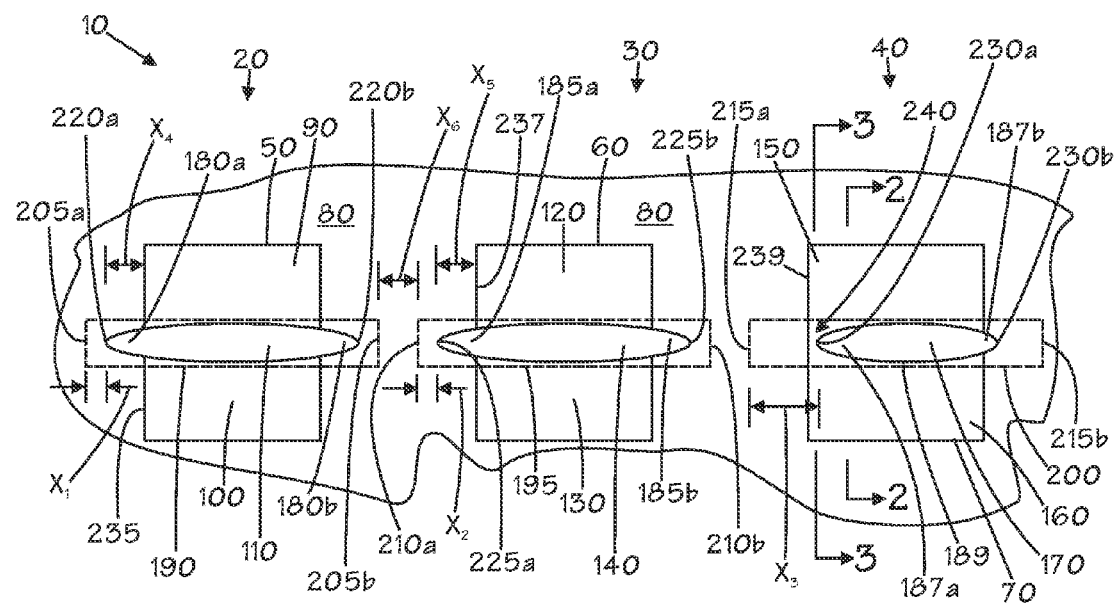
FIG. 1 is an overhead view of an exemplary conventional semiconductor chip that includes a plurality of field effect transistors, three of which are shown and labeled.

In the drawings described below, reference numerals are generally repeated where identical elements appear in more than one figure. Turning now to the drawings, and in particular to FIG. 1, therein is shown an overhead view of an exemplary conventional semiconductor chip 10 that includes a plurality of field effect transistors, three of which are shown and labeled 20, 30 and 40 respectively. The transistors 20, 30 and 40 are formed on respective active regions 50, 60 and 70. The active regions 50, 60 and 70 are laterally isolated electrically by way of an isolation structure 80. The transistor 20 includes source/drain impurity regions 90 and 100 and overlying gate electrode 110. The transistor 30 similarly includes source/drain regions 120 and 130 and a gate electrode 140. Finally, the transistor 40 includes source/drain regions 150 and 160 and a gate electrode 170. The gate electrodes 110, 140 and 170 have respective endcaps 180a, 180b, 185a, 185b, 187a and 187b. The gate 170 has an edge that is labeled 189.

Three dashed boxes 190, 195 and 200 surround, respectively, the gate electrodes 110, 140 and 170. The boxes 190, 195 and 200 represent the intended layouts of the gate electrodes 110, 140 and 170. The planned layout 190 has opposite edges 205a and 205b. Similarly, the planned layouts 195 and 200 have respective opposite edges 210a and 210b, and 215a and 215b. Note that the gate electrodes 110, 140 and 170 have oval footprints that do not exactly match the planned layouts 190, 195 and 200. The oval shapes themselves stem from optical effects during mask exposure and endcap etching effects during gate etch.

FIG. 1 illustrates the phenomena referred to as endcap pullback in the Background section hereof. The endcaps 180a and 180b of the gate 110 have tips 220a and 220b that are receded from the edges 205a and 205b of the planned layout 190. The endcaps 185a and 185b of the gate electrode 140 similarly have tips 225a and 225b that are receded laterally the edges 210a and 210b of the layout 195. Finally, the endcaps 187a and 187b of the gate 170 have respective tips 230a and 230b that are receded from the edges 215a and 215b of the layout 200. The recession of the tips 220a, 220b, 225a, 225b, 230a and 230b may be due to mask registration errors during lithographic patterning of the gates 110, 140 and 170 and/or other process variations.

Using the tips 220a, 225a and 230a of the respective gates 110, 140 and 170, the amount of recession of the tips or endcap pullback is given by the lateral dimensions $X_1$, $X_2$ and $X_3$. After gate etch and mask removal, respective overlaps $X_4$ and $X_5$ remain between the endcaps 220a and 225a and the borders 235 and 237 between the isolation structure 80 and the active regions 50 and 60. However, the recession of the gate electrode 170 and the endcap 230a thereof is severe enough so as to effectively eliminate full overlap between the gate electrode 170 and the active region 70 such that there is a gap 240 between the tip 230a of the gate 170 and the border 239 between the active region 70 and the isolation structure 80.

Conventional design rules prescribe some preferred amount of endcap pullback, measured either by a dimension, such as the dimension $X_1$, for a given gate or the dimension $X_4$. In a conventional technique for monitoring the amount of endcap pullback, either the dimensions $X_1$, $X_4$ or $X_5$ are monitored by way of scanning electron microscopy. In some cases, the tip-to-tip distance, such as the distance $X_6$ between the tips 220b and 225a of the respective gates 110 and 140 is measured, again by scanning electron microscopy. The disadvantage of this conventional technique was described elsewhere in the Background section hereof. The amount of permissible endcap pullback in a given design rule is, like many types of design rules, a compromise between various competing factors in a layout design, such as, for example, packing density, lithographic processing limitations, electrical requirements, heat propagation or the like. The amount of permissible endcap pullback is limited by various error sources, such as mask registration errors and critical dimension variations in gates and active regions.

Figure 2:
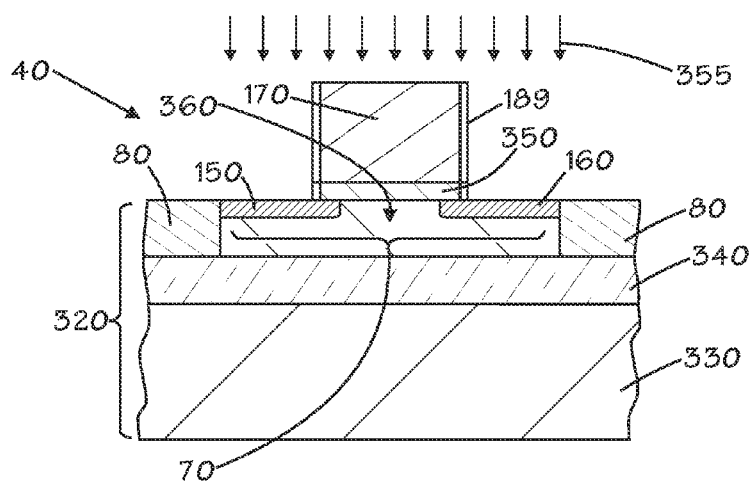
FIG. 2 is a sectional view of FIG. 1 taken at section 2-2.

Attention is now turned to FIG. 2, which is a sectional view of FIG. 1 taken at section 2-2. Note that only the transistor 40 is visible in FIG. 2. Note also that because of the position of section 2-2 and the less than perfectly rectangular footprint of the gate electrode 170, the edge 189 of the gate 170 is visible but not shown in section. The transistor 40 is implemented on a semiconductor-on-insulator substrate 320 that consists of a base substrate 330 of silicon upon which an oxide layer 340 is positioned. Of course, bulk semiconductor may be used instead of semiconductor-on-insulator. The active region 70 is shown isolated laterally by the isolation structure 80. The gate electrode 170 is positioned on a gate dielectric layer 350. Together, the gate electrode 170 and the gate dielectric layer 350 serve as an implant mask during an implantation of ions 355 to form the source/drain regions 150 and 160. Since there is ample coverage by the gate electrode 170 and the underlying gate dielectric layer 350 at the position where section 2-2 is taken, there will be adequate implant masking such that a channel region 360 of relatively light impurity concentration will remain beneath the gate electrode 175 following the source/drain region implant.

Figure 3:
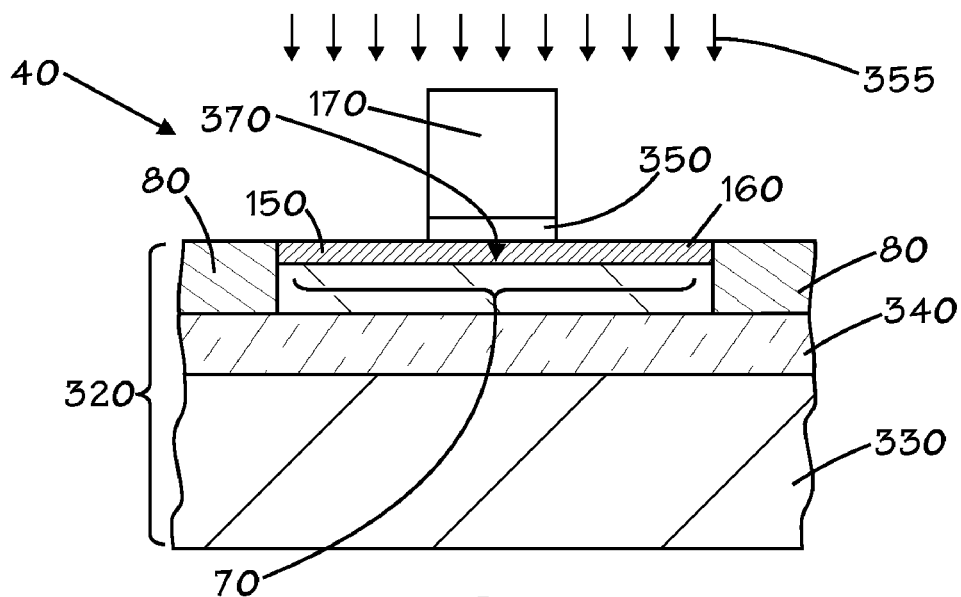
FIG. 3 is a sectional view of FIG. 1 taken at section 3-3.

The fallout of a higher than anticipated endcap pullback is depicted in FIG. 3, which is a sectional view of FIG. 1 taken at section 3-3. Note that section 3-3 is taken through the gap 240 between the tip 230a of the gate 170 and the edge 239 of the active region 70. Note also that since section 3-3 is taken through the gap 240, the gate electrode 170 and the underlying gate dielectric layer 350 do not appear in section and thus are not cross hatched. Again, the base substrate 330, the overlying oxide layer 340 and the isolation structure 80 are visible. Here, because of the excessive endcap pullback and the presence of the gap 240, implantation of ions 355 to establish the source/drain regions 150 and 160 depicted in FIG. 1 proceeds without masking in the gap 240. This results in the source/drain regions 150 and 160 effectively merging in the region numbered 370. Thus, there is no channel region in the region 370 and there is an effective electrical short established between the source/drain region 150 and the source/region 160 in the vicinity of the gap 240. Such a short is an undesirable feature to have in a semiconductor device.

Figure 4:
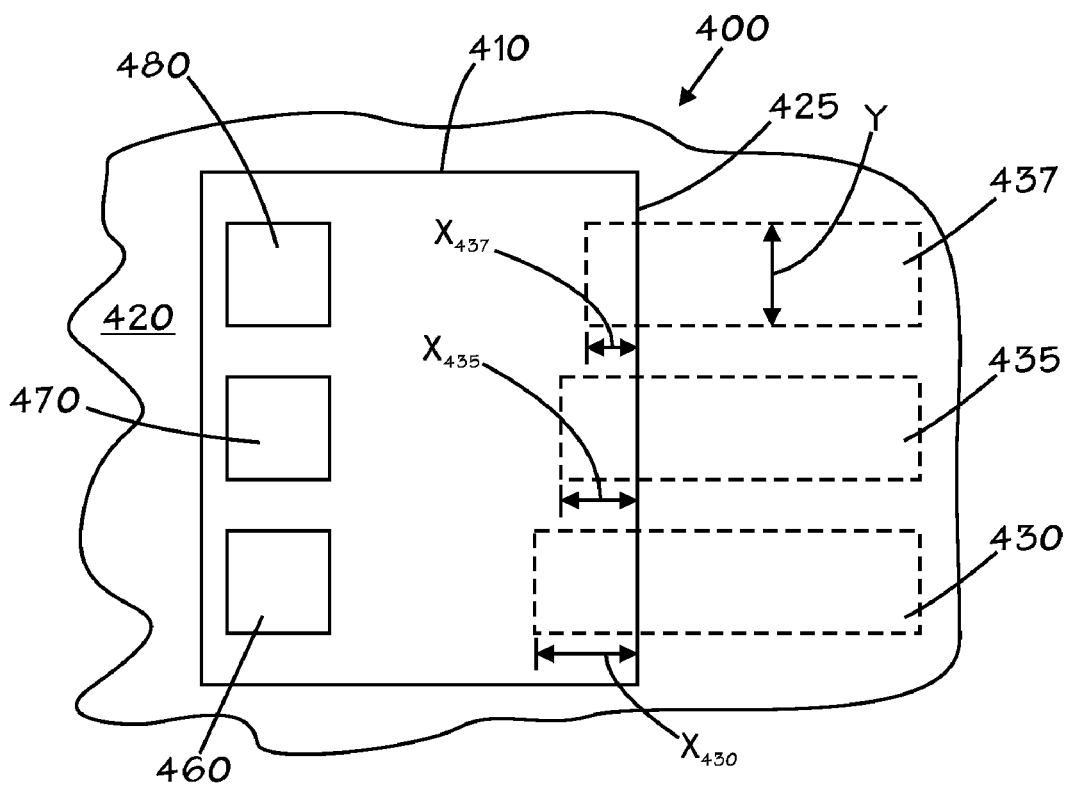
FIG. 4 is an overhead view of an exemplary embodiment of a diagnostic circuit device at a stage of fabrication.
Figure 5:
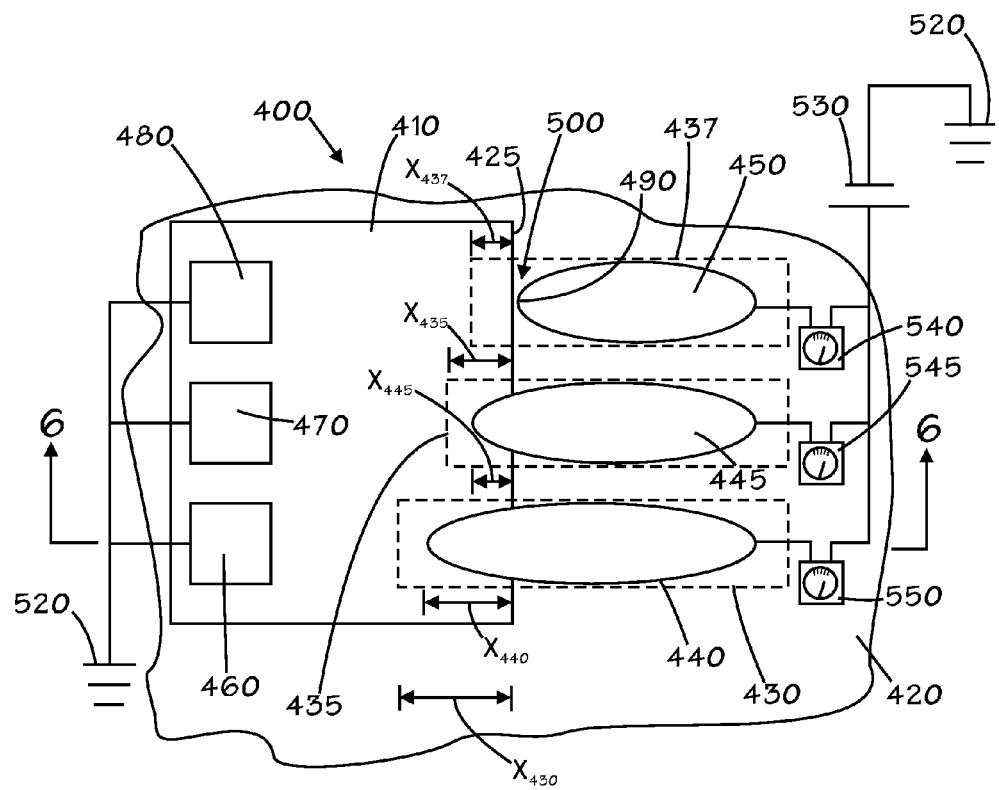
FIG. 5 is an overhead view of the exemplary embodiment of a diagnostic circuit device at a later stage of fabrication.
Figure 6:
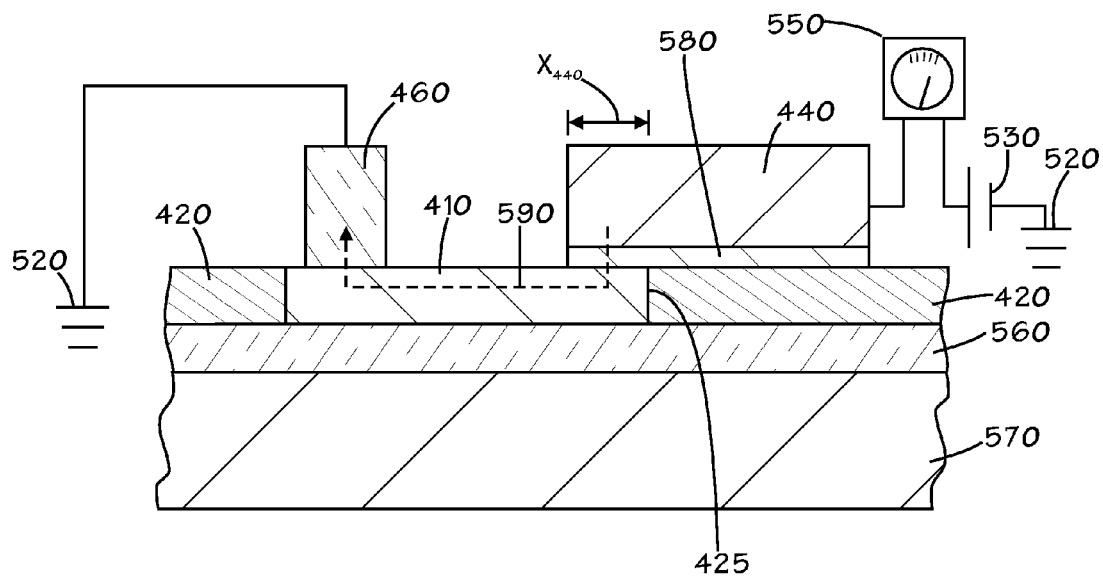
FIG. 6 is a sectional view of FIG. 5 taken at section 6-6.

An exemplary process for forming a structure for accurately monitoring the amount of endcap pullback may be understood by referring now to FIGS. 4, 5 and 6 and initially to FIG. 4. FIG. 4 depicts an overhead view of a portion of a semiconductor device 400 that includes an active area 410 surrounded by isolation structure 420. The active area 410 and the isolation structure define a border 425. The planned layouts of three conductor structures are represented by the dashed boxes 430, 435 and 437. The three conductor structures will be lithographically patterned on the circuit device 400 with respective planned overlaps $X_{430}$, $X_{435}$ and $X_{437}$ with the active region 410. In other words, one of the later-formed conductor structures should have an end that projects across the border 425 a distance $X_{430}$ and so on for the other later-formed conductor structures. The distances $X_{435}$ and $X_{437}$ are progressively smaller than the distance $X_{430}$. The planned layouts 430, 435 and 437 may be provided with a dimension or width Y that may or may not be the minimum device geometry available for the lithographic process.

Attention is now turned to FIG. 5, which is an overhead view of the semiconductor device 400 following additional processing. Conductor structures 440, 445 and 450 have been formed by material forming and lithographic patterning techniques according to the planned layout. As expected, the conductor structures 440, 445 and 450 have footprints that do not exactly match the planned layouts 430, 435 and 437. The mismatch is at least partly due to endcap pullback. As a result of endcap pullback, the planned overlaps $X_{430}$ and $X_{435}$ with the border 425 for the conductors 440 and 445 are actually the smaller overlap dimensions $X_{440}$ and $X_{445}$. However, the endcap pullback of the conductor structure 450 is great enough that the tip 490 thereof no longer extends across the border 425. A gap 500 exists between the tip 490 and the border 425.

The device 400 is designed to efficiently determine the amount of actual pullback that occurs for various planned pullbacks. In this way, design rules can be developed that reduce die area consumption while preserving device performance. To accomplish the task, the device 400 is designed to monitor leakage current propagating from the conductor structures 440, 445 and 450 into the active region 410. The leakage currents will provide an indication of the actual positions of the ends, such as the tip 490, of the conductor structures 440, 445 and 450 relative to the border 425. In order to establish circuits, respective contacts 460, 470 and 480 are fabricated on the active region 410. The contacts 460, 470 and 480 may be formed before, after or concurrently with the conductors 440, 445 and 450. The contacts 460, 470 and 480 are connected to ground 520. The conductor structures 440, 445 and 450 are connected to a voltage source 530 and to a current sensing instruments 540, 545 and 550. When the voltage source 530 is turned on, leakage currents may flow from the conductors 440, 445 and 450 into the active region 410 and to the contacts 460, 470 and 480 that are grounded. Optionally, the conductors 430, 440 and 450 could be grounded and the contacts 460, 470 and 480 biased. The leakage currents are sensed by instruments 540, 545 and 550, which may be ammeters.

The flow of leakage currents may be understood by referring now to FIG. 6, which is a sectional view of FIG. 5 taken at section 6-6. Note that because of the location of section 6-6, the contact 460 is shown in section as well as the isolation structure 420. The isolation structure 420 surrounds the active region 410. The semiconductor device 400 may be implemented on a semiconductor-on-insulator substrate 550 as shown in FIG. 6 that consists of a silicon layer formed on an insulating layer 560 and an underlying substrate 570. Again, bulk semiconductor could also be used. The silicon layer is circumscribed by the isolation structure 420 to provide the active region 410 As depicted in FIG. 5 as well, the overlap $X_{440}$ between the conductor structure 440 and the border 425 of the active region 410 is more than sufficient to enable leakage currents to propagate from the conductor 440 through an underlying gate dielectric layer 580 into the active region 410 and up into the contact 460 as represented by the dashed line 590. The movement of current through the dielectric layer 580 into the active region 410 is via direct tunneling. The amount of leakage current for the conductor 440 will be somewhat larger than the leakage current for the conductor 445 due to the larger amount of overlap $X_{440}$ versus the overlap $X_{445}$. However, the current flow for the conductor 450 is a different matter. Indeed, the excessive endcap pullback of the tip 490 and the attendant gap 500 means that there is effectively an open circuit and thus substantially zero leakage current will flow from the conductor 450 into the active region 410. This zero or near zero current will be detected by the instrument 540 and be indicative of a pullback that is beyond the border 425 of the active region 410. The lack of a leakage current can thus be interpreted as an amount of endcap pullback that exceeds some preferred maximum amount. Design rules can be changed as necessary to avoid the excessive pullback for another group of conductors or devices to be fabricated.

It is anticipated that just two or three conductor structures with staggered endcap distances relative to the border 425 could be used. More subtle findings may be made where larger numbers of conductor structures are used in conjunction with small differences in distance to the border 425 for two given conductor structures.

Well-known lithographic patterning and material shaping techniques may be used to form the conductor structures 440, 445 and 450 and the contacts 460, 470 and 480. Suitable materials include, for example, doped polysilicon, metals such as aluminum, tantalum, platinum, titanium, tungsten, titanium nitride, mixtures of these or the like. It may be advantageous to form the conductor structures 440, 445 and 450 from the same materials used to form active gates. The dielectric layers, such as the layer 580 (see FIG. 6) may be formed from oxides of silicon, high-K materials, silicon nitride, oxynitride, laminates of these or the like.

Figure 7:
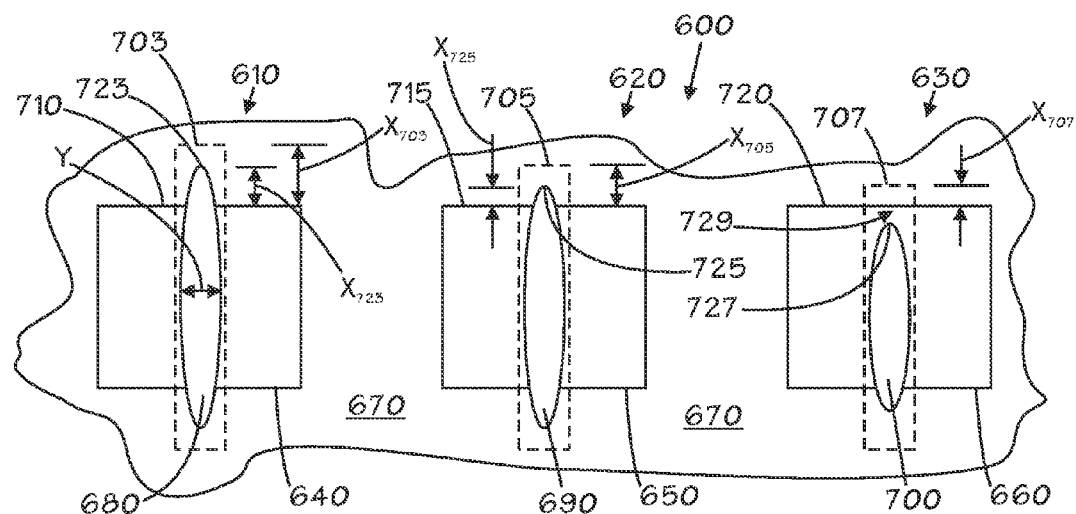
FIG. 7 is an overhead view of another exemplary embodiment of a diagnostic circuit device at a stage of fabrication.
Figure 8:
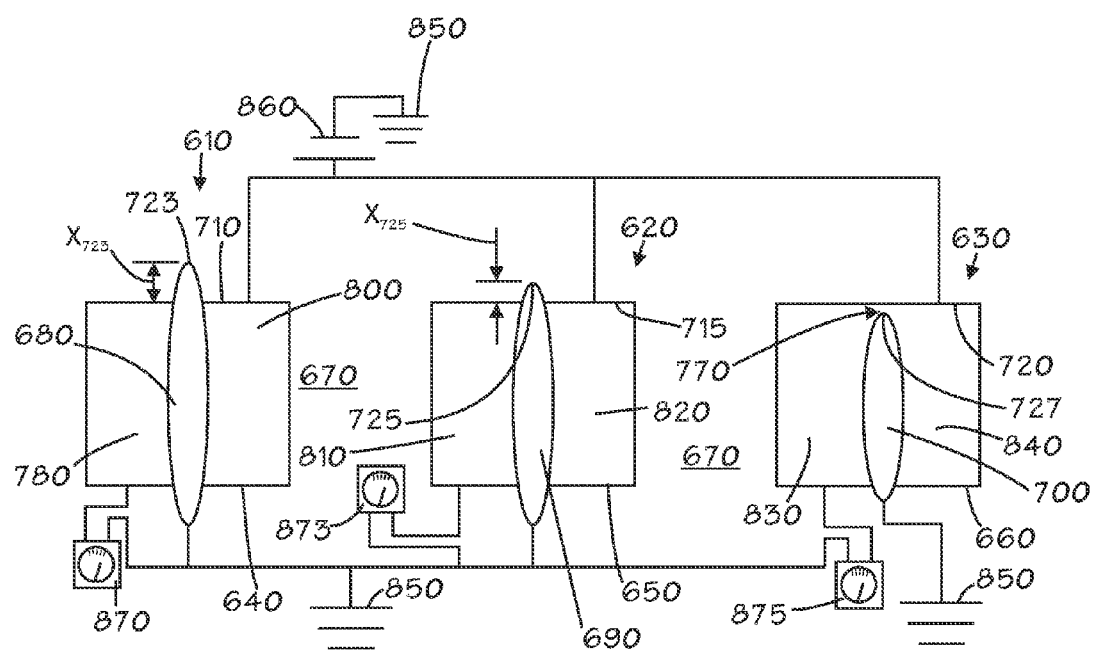
FIG. 8 is an overhead view of the alternate exemplary embodiment of a diagnostic circuit device at a later stage of fabrication.

An alternate exemplary process for fabricating an alternate exemplary device capable of monitoring endcap pullback may be understood by referring now to FIGS. 7 and 8 and initially to FIG. 7. FIG. 7 is an overhead view of a semiconductor device 600 that includes three field effect transistors 610, 620 and 630 formed on respective active regions 640, 650 and 660. The active regions 640, 650 and 660 are surrounded by isolation structures 670. The devices 610, 620 and 630 are provided with respective gates 680, 690 and 700. The gates 680, 690 and 700 may be fabricated from the same types of materials discussed above in connection with the conductor structures and contacts depicted in FIGS. 5 and 6. Note that at this stage, source/drain regions are not established in the active regions 640, 650 and 660.

In order to investigate the effect of endcap pullback, the gates 680, 690 and 700 are lithographically patterned with planned layouts represented by the dashed boxes 703, 705 and 707. The planned layouts 703, 705 and 707 are designed to have respective planned overlaps $X_{703}$, $X_{705}$ and $X_{707}$ with borders 710, 715 and 720 of the active regions 640, 650 and 660. After patterning, tips 723, 725 and 727 of the gates 680, 690 and 700 are pulled back. The tips 723 and 725 have overlaps $X_{723}$ and $X_{725}$. However, the tip 727 is pulled back to such an extent that a gap 729 exists between the tip 727 and the active border 720.

Attention is now turned to FIG. 8, which is an overhead view of the circuit device 600 following additional processing. Following gate definition, source/drain regions 780, 800, 810, 820 and 830 are formed for the respective transistor 610, 620 and 630. The source/drain regions 780, 800, 810, 820 and 830 may be formed by well-known ion implantation techniques. The respective pullback distances $X_{723}$, $X_{725}$ and the gap 729 may be exploited to provide an indication of the actual positions of the ends 723, 725 and 727 of the gates 680, 690 and 700 relative to their respective borders 710, 715 and 720 and thus monitor the effect of certain values of endcap pullback. In this regard, the source regions 780, 810 and 830 of the transistors 610, 620 and 630 may be tied to a ground 850 and the drain regions 800, 820 and 840 may be tied to a voltage source 860. In addition, the source regions 780, 810 and 830 may be tied to current sensing instruments 870, 873 and 875 such that when the voltage source 860 is turned on, some level of leakage currents will flow to ground 850 that can be monitored by the instruments 870, 873 and 875. Finally, the gates 680, 690 and 700 may be tied to ground 850 so that an off-state leakage currents can be monitored. In this regard, the transistors 610, 620 and 630 could be N-channel devices. However, P-channel devices could be used and the gates 680, 690 and 700 could be biased to an off-state in an alternate configuration. In any event, the level of leakage current for the transistor 630 will be significantly higher than either the transistors 610 or 620 due to the excessive pullback and attendant gap 729. Indeed, the gap 729 results in a direct short between source/drain regions 830 and 840 of the type depicted in FIG. 3. The level of leakage current for each of the transistors 610, 620 and 630 may be assessed and judgements may be made regarding the acceptable level of endcap pullback $X_{723}$, $X_{725}$, etc. in view of the leakage currents. Design rules can be changed as necessary to avoid the excessive pullback for another group of conductors or devices to be fabricated.

It is anticipated that just two or three transistors 610, 620 and 630 etc. with staggered endcap distances relative to respective borders 710, 715 and 720 could be used. More subtle findings may be made where larger numbers of transistors are used in conjunction with small differences in distance to respective active-to-isolation borders for successive transistors.

Figure 9:
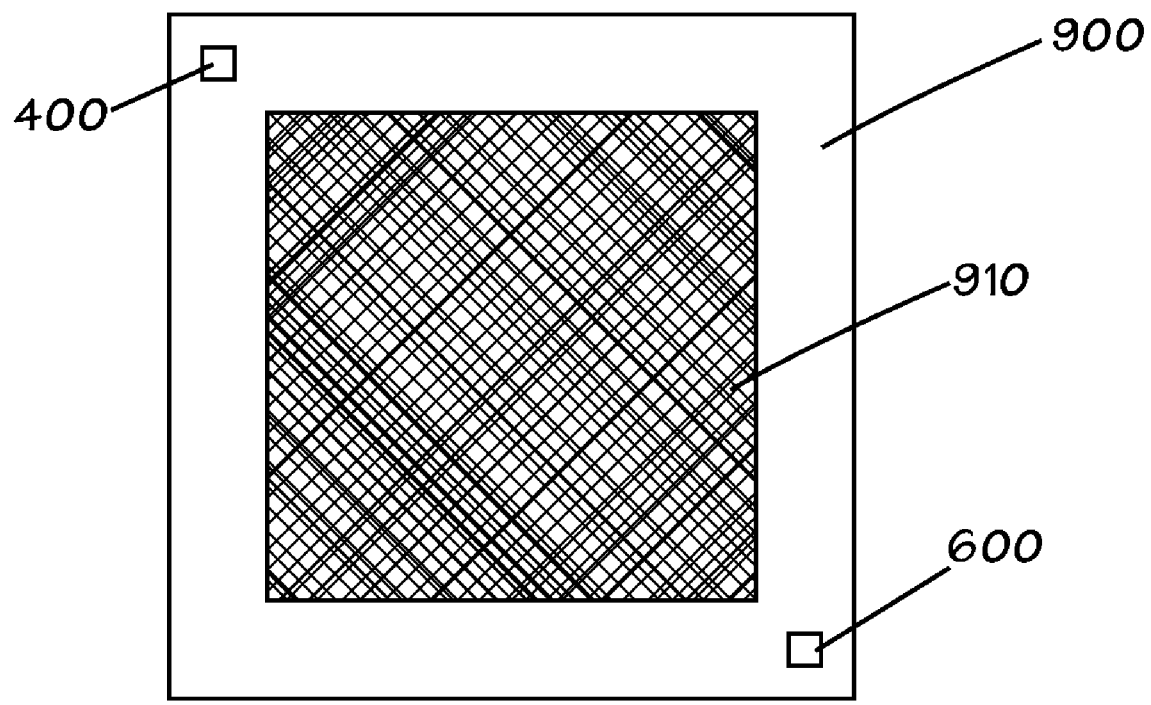
FIG. 9 is an overhead view of an exemplary embodiment of an integrated circuit incorporating the diagnostic devices of FIGS. 6 and 9.

It should be understood that the embodiments disclosed herein could be implemented on a test chip or as part of a device intended for commercial use, such as a processor. For example, FIG. 9 depicts a plan view of an exemplary integrated circuit 900 that includes a circuit core 910 and the circuit devices 400 and 600 described herein. The integrated circuit could be a test chip or commercial processor.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a substrate having a semiconductor region and an insulating structure, the semiconductor region and the insulating structure defining a border;
forming plural conductor structures on the substrate according to a planned layout in which a first of the conductor structures having a first end projecting across the border over the semiconductor region a first planned distance and the other conductor structures having ends projecting respectively smaller planned distances across the border over the semiconductor region; and
electrically connecting the semiconductor region and the conductor structures between a voltage source and ground, levels of currents flowing through the semiconductor region to or from the conductor structures being indicative of the actual positions of the first end of the first conductor and the ends of the other conductor structures relative to the border.

2. A method of manufacturing, comprising:
providing a substrate having a semiconductor region and an insulating structure, the semiconductor region and the insulating structure defining a border;
forming plural conductor structures on the substrate according to a planned layout in which a first of the conductor structures having a first end projecting across the border over the semiconductor region a first planned distance and the other conductor structures having ends projecting respectively smaller planned distances across the border over the semiconductor region;
electrically connecting the semiconductor region and the conductor structures between a voltage source and ground; and
monitoring currents flowing through the semiconductor region to or from the conductor structures, the levels of the currents being indicative of the actual positions of the first end of the first conductor structure and the ends of the other conductor structures relative to the border.

3. A method of manufacturing, comprising:
providing a substrate having a plurality of semiconductor regions, each of the plurality of semiconductor regions having a border with an insulating structure;
forming a transistor in each of the plurality of semiconductor regions according to a planned layout in which each of the transistors including a gate, a first of the gates having an end projecting across its border a first planned distance and the other gates having ends projecting respectively smaller planned distances across their corresponding borders;
electrically connecting the transistors between a voltage source and ground, levels of leakage currents flowing through the transistors being indicative of the actual positions of the ends of the gates relative to their corresponding borders.

4. The method of claim 1, wherein formation of plural conductor structures comprises forming plural polysilicon structures.

5. The method of claim 1, comprising forming an insulating layer between the conductor structures and the substrate.

6. The method of claim 1, wherein the substrate comprises a test chip.

7. The method of claim 1, wherein the substrate comprises a processor.

8. The method of claim 1, wherein the semiconductor region comprises silicon.

9. The method of claim 1, wherein the forming the conductor structures comprises forming metal conductor structures.

10. The method of claim 1, comprising identifying each of the conductor structures that produces substantially zero current, and tailoring a subsequent process to form a new group of conductor structures so that the new group of conductors structures are formed with ends projecting past their corresponding borders farther than the distances of those conductor structures producing substantially zero current.

11. The method of claim 2, wherein formation of plural conductor structures comprises forming plural polysilicon structures.

12. The method of claim 2, comprising forming an insulating layer between the conductor structures and the substrate.

13. The method of claim 2, wherein the substrate comprises a test chip.

14. The method of claim 2, wherein the substrate comprises a processor.

15. The method of claim 2, wherein the semiconductor region comprises silicon.

16. The method of claim 2, wherein the forming the conductor structures comprises forming metal conductor structures.

17. The method of claim 2, comprising identifying each of the conductor structures that produces substantially zero current, and tailoring a subsequent process to form a new group of conductor structures so that the new group of conductors structures are formed with ends projecting past their corresponding borders farther than the distances of those conductor structures producing substantially zero current.

18. The method of claim 3, wherein formation of gates comprises forming plural polysilicon gates.

19. The method of claim 3, wherein the substrate comprises a test chip.

20. The method of claim 3, wherein the substrate comprises a processor.

21. The method of claim 3, wherein the semiconductor regions comprise silicon.

22. The method of claim 3, wherein the forming the gates comprises forming metal gates.

23. The method of claim 3, comprising identifying each transistor that produces substantially non-zero leakage current, and tailoring a subsequent process to form a new group of transistor gates so that the new group of transistor gates are formed with ends projecting past their corresponding borders farther than the distances of those gates producing substantially non-zero current.

* * * * *